United States Patent
Parrish et al.

(10) Patent No.: US 10,147,861 B2
(45) Date of Patent: Dec. 4, 2018

(54) THERMOELECTRIC GENERATOR

(71) Applicant: JikoPower, Inc., Auburn, WA (US)

(72) Inventors: Daniel Allen Parrish, Mountlake Terrace, WA (US); Aaron Zane Owen, Seattle, WA (US); Ryan Anthony Ahearn, Seattle, WA (US); Michael Jooste, Seattle, WA (US)

(73) Assignee: JikoPower, Inc., Auburn, WA (US)

( * ) Notice: Subject to any disclaimer, the term of this patent is extended or adjusted under 35 U.S.C. 154(b) by 402 days.

(21) Appl. No.: 15/140,313

(22) Filed: Apr. 27, 2016

(65) Prior Publication Data

US 2016/0315241 A1 Oct. 27, 2016

Related U.S. Application Data

(60) Provisional application No. 62/153,421, filed on Apr. 27, 2015.

(51) Int. Cl.
*H02J 7/00* (2006.01)
*H01L 35/30* (2006.01)
*H01L 35/32* (2006.01)

(52) U.S. Cl.
CPC .............. *H01L 35/30* (2013.01); *H01L 35/32* (2013.01); *H02J 7/0045* (2013.01); *H02J 2007/0001* (2013.01)

(58) Field of Classification Search
CPC ........................................................ H02J 7/0045
USPC .................................................. 320/101
See application file for complete search history.

(56) References Cited

U.S. PATENT DOCUMENTS

| | | | | |
|---|---|---|---|---|
| 6,233,944 B1* | 5/2001 | Yamada | ........... | H01L 35/32 62/3.7 |
| 2003/0192582 A1* | 10/2003 | Guevara | ........... | H01L 35/00 136/205 |
| 2006/0068272 A1* | 3/2006 | Takami | ........... | B60L 3/0046 429/62 |
| 2014/0266002 A1* | 9/2014 | Nies | ........... | H01L 35/32 320/101 |
| 2016/0003502 A1* | 1/2016 | Zelissen | ........... | F25B 21/02 136/205 |

* cited by examiner

*Primary Examiner* — Yalkew Fantu
(74) *Attorney, Agent, or Firm* — Benedict R. Dugan; Lowe Graham Jones PLLC

(57) ABSTRACT

A thermoelectric generation unit for a cookstove or other heat source is described. The thermoelectric generation unit includes a probe, a thermoelectric module, and a fluid reservoir. The probe draws heat from a heat source such as a wood cookstove. The thermoelectric module generates an electric current based on a heat gradient created by different temperatures of contents of the fluid reservoir and the probe.

20 Claims, 7 Drawing Sheets

THERMOELECTRIC GENERATOR

CROSS-REFERENCE TO RELATED APPLICATION

This application claims the benefit of priority from U.S. Provisional Patent Application No. 62/153,421 filed Apr. 27, 2015, which application is incorporated herein by reference in its entirety.

TECHNICAL FIELD

The present disclosure relates to thermoelectric generation and, more particularly, to thermoelectric generation devices, systems, and methods configured to generate and/or provide electricity based on a heat source such as a cookstove.

DETAILED DESCRIPTION

Figure 1:
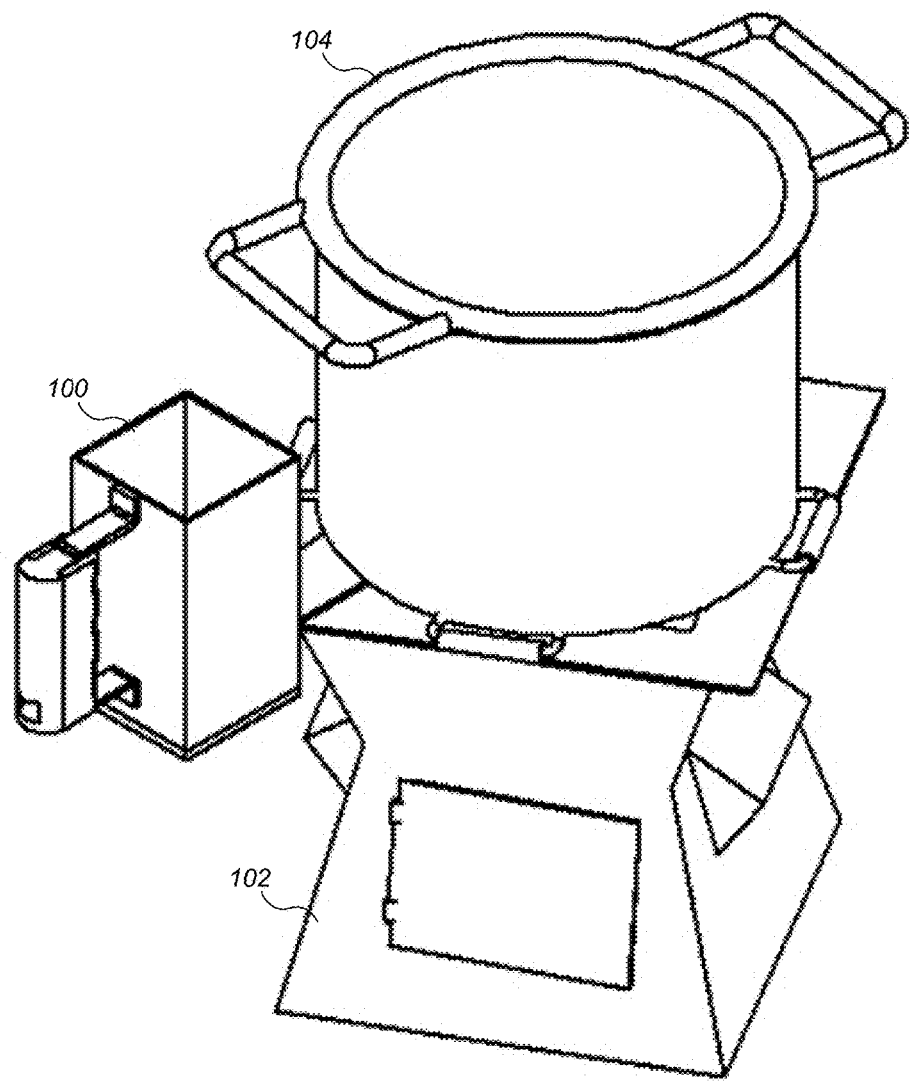
FIG. 1 depicts an example thermoelectric generation unit in its operating environment.

FIG. 1 depicts an example thermoelectric generation unit ("TGU") in its operating environment. More particularly, FIG. 1 shows a TGU 100 coupled to a biomass cookstove 102, positioned adjacent to a cookpot 104.

Figure 2:
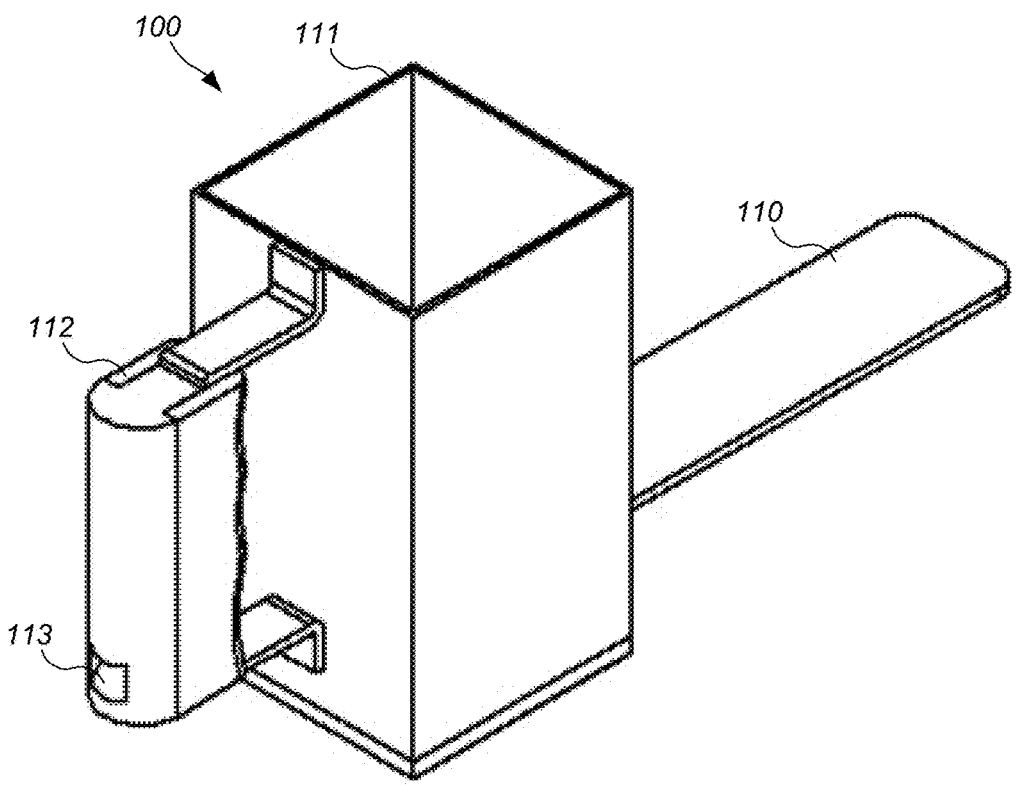
FIG. 2 is an isometric view of a thermoelectric generation unit according to an example embodiment.

FIG. 2 is an isometric view of the TGU 100. This embodiment of the TGU 100 includes a thermally conductive probe 110 of high thermal conductive material such as copper, aluminum, silicon carbide or similar. FIG. 2 shows the probe 110 upon which a fluid reservoir 111 can be mounted. Within this reservoir 111 is a phase liquid such as water.

Different sizes and dimensions for the reservoir are contemplated. In one embodiment, the reservoir 111 a maximum of 4 inches wide, 3 inches deep, and 7 inches tall. The reservoir 111 may in some embodiments have a base dimension that is between 9 and 16 square inches, and a height that is between 2 and 7 inches. The reservoir 111 may instead be a cylinder in some embodiments.

The TGU 100 includes a thermoelectric module ("TEM") that generates an electrical current based on the heat gradient between the probe 110 and the contents of the reservoir 111. The TEM is not visible in FIG. 2, but is shown and further described with respect to FIG. 6, below.

The TGU 100 also includes a handle 112 so that the TGU 100 may be manipulated during operation. The handle 112 includes a frame that is metallic and may be aluminum, steel or other. The handle frame is secured to the reservoir via welding, riveting or similar joining method. The handle 112 also includes a grip that is constructed of metal, wood, or heat resistant plastic such as ABS or other.

The handle 112 may include (e.g., within its grip) a voltage regulating circuit (e.g., buck boost or similar), adapted to boost or drop the chaotic voltage output from the TEM to a constant voltage. For example, the voltage regulating circuit may level the voltage at 5V to comply with USB standards. The circuit is typically designed as to minimize electrical loss and to maximize available power to device to be charge. The circuit may adhere to the dedicated charging port USB guidelines for a dedicated charging port described further below.

The handle 112 also includes a charging port 113. The charging port 113 may be, for example, a USB charging port to allow users to charge USB compatible devices using the electricity generated by the TGU 100. The charging port 113 may also provide data connectivity for a coupled computing device. Wires connecting the USB voltage regulating circuit to the TEM (see FIG. 6) are run through a hollow tunnel in the handle frame, through a trough cut into the handle frame or using a similar method for running wire. Other embodiments may contain a battery or other energy storage device within the handle 112, where electricity may be stored for use later.

The handle 112 may take other configurations in other embodiments. For example, instead of a vertical arrangement attached to the side of the reservoir 111 (as shown), the handle 112 may be oriented horizontally across the top of the reservoir 111. Furthermore, the handle 112 may have a lesser or greater number of attachment points to the reservoir 111. As another example, the charging port 113 may be located elsewhere on the TGU 100.

Other embodiments may contain metering logic within the handle 112 that prevents charge from being extracted until a payment (e.g., mobile or card payment) is made. The metering logic may facilitate one or more payment models, including "pay-as-you-go," contract payments, or the like. Payments (e.g., mobile payments) may be made either for the unit of charge desired (e.g., 0.50 USD for 1000 mAh) or for unlimited use for a finite period of time (e.g., unlimited charging for 1 week for 5.00 USD). The metering logic is fitted with a unique serial number or other identification method which may be entered into payment processing software installed on a mobile device or similar. Once payment is received, the TGU is unlocked and charge may be extracted. When credits are expended the device once again becomes inert until additional payments are made.

In some embodiments, the metering logic functions in cooperation with a payment processing system. The payment system may be organized by a service provider (e.g., cell phones or other mobile devices) but may also be hosted by a distinct power generation facilitator service itself on its own private servers. In either case, the servers will act as cloud servers that phones will connect to in order to authenticate payment. Once payment has been confirmed (or sufficient credits, status, phone package, etc.) a phone will receive a unique one-way key to unlock the device. This code is then sent to the metering logic that exists on the TGU 100 itself.

The metering logic is assigned a unique identifier at the time of manufacturing. This identifier is then used to check the code sent by the cloud server to ensure that the mobile device is legitimate. If the mobile device registers a legitimate code sent by the cloud server, the metering logic will unlock a charge. Concurrently, the metering logic may send back data about the generator and stove information about the device. This information might include information such as usage rates, pollution values, efficiency of device, recommended maintenance, metadata, and geo-location data for tracking purposes. This data is then sent to the central power distribution service via the cellular network.

In order to transmit data back to the power generation facilitator service (or other tracking service), the TGU will include data-capture and tracking logic. Such logic may include one or more sensors (e.g., temperature, location, air quality) and a corresponding storage facility (e.g., static memory) for storing sensor and usage data for later upload. See FIGS. 7 and 8 below for more details.

Figure 3:
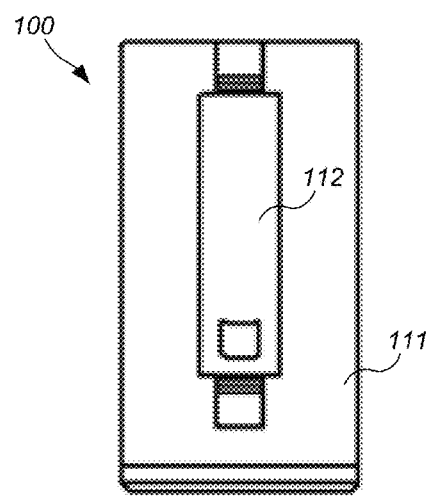
FIG. 3 is a front view of a thermoelectric generation unit according to an example embodiment.
Figure 4:
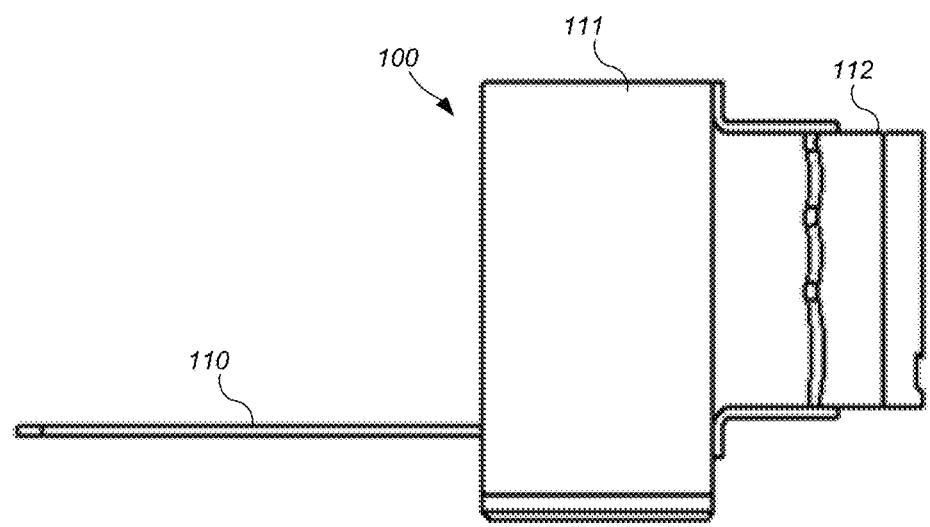
FIG. 4 is a side view of a thermoelectric generation unit according to an example embodiment.
Figure 5:
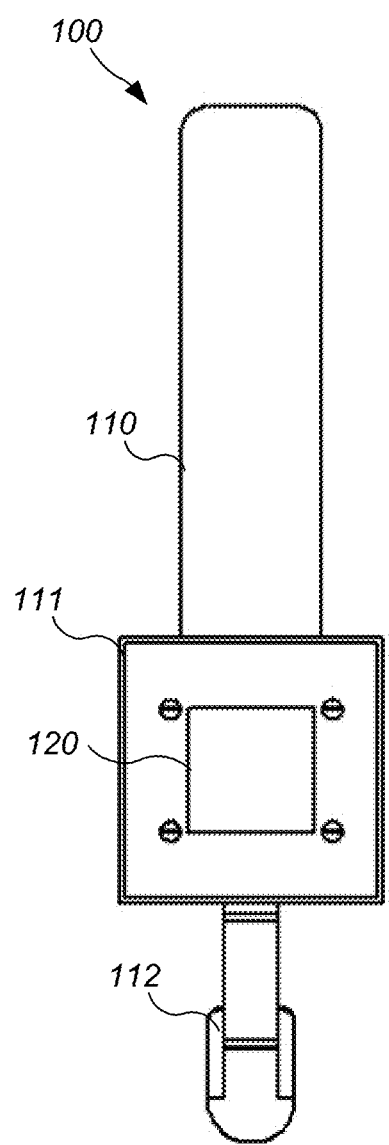
FIG. 5 is a top view of a thermoelectric generation unit according to an example embodiment.

FIGS. 3-5 respectively provide front, side, and top views of the TGU 100. In these various views, one or more of the probe 110, reservoir 111, and handle 112 are visible.

Figure 6:
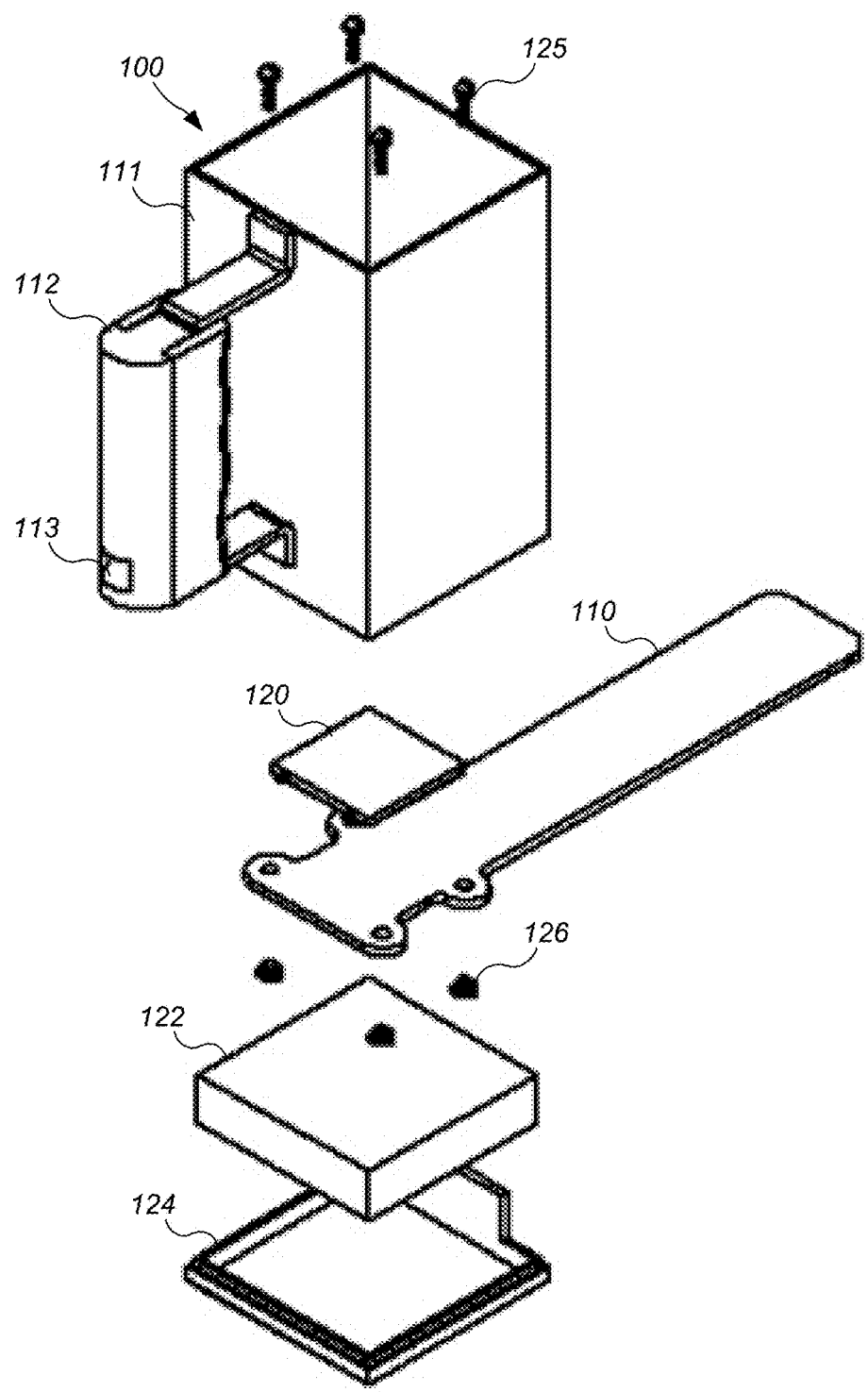
FIG. 6 is an exploded view of a thermoelectric generation unit according to an example embodiment.

FIG. 6 is an exploded view of the TGU 100. In addition to the probe 110, reservoir 111, and handle 112, FIG. 6 shows a thermoelectric module (TEM) 120. The TEM 120 is compressed between the thermally conductive probe 110 and the fluid reservoir 111. The TEM 120 has a hot side in contact with the probe 110 and cold side in contact with the reservoir 111. The TEM 120 itself may be comprised of bismuth telluride, lead telluride silicon germanium, bismuth-antimony or other similar material.

The TEM 120 is part of a circuit that generates electricity when exposed to a temperature gradient developed within the TGU 100. In particular, when the reservoir 111 contains a phase liquid (e.g., water) and the thermally conductive probe 110 is placed in contact with a fire or other heat source, the difference in temperature between the hot side of the TEM 120, in contact with the probe 110, and the cold side of the TEM, in contact with the phase liquid in the reservoir 111, causes the movement of charge carriers within the TEM 120, creating electric potential due to the Seebeck effect. When the circuit is closed, the result is a flow of electrical current.

As noted above, the TGU 100 may output (e.g., via the port 113) standard 5-volt USB, making it compatible with many small devices. The TGU 100 may include a circuit that provides a dedicated charging port ("DCP") according to USB guidelines. USB dedicated charging ports include power sources like wall warts and auto adapters that do not enumerate so that charging can occur with no digital communication at all. DCPs can supply up to 1.5A and are identified by a short between D+ to D−. This allows the creation of DCP "wall warts" that feature a USB mini or micro receptacle instead of a permanently attached wire with a barrel or customized connector. Such adapters allow any USB cable (with the correct plugs) to be used for charging.

As noted, other embodiments may contain energy storage devices such as batteries or similar used to store electricity generated for later use, which may be accessed on use or through metering logic discussed above. Other embodiments may be focused on charging higher voltage devices as well and may contain a variable voltage output.

Between the probe 110 and the hot side of the TEM 120, highly conductive thermal interface material such as graphite or graphite infused silicone grease or copper infused silicone grease or similar may be used to aid in heat transfer between the two components. In order to maximize heat transfer, small gaps in thermal contact are avoided by using this material that is either a viscous, thermally conductive fluid or compressible solid.

The TEM 120 is secured to the reservoir 111 using screws 125 or similar mounting/attachment mechanisms. The screws 125 secure the TEM 120 to the reservoir and the probe 110. The probe 110 is compressed against the TEM 120 to a prescribed pressure to optimize the heat flux through the TEM 120. Insulation is placed on the sides of the TEM 120 to further aid in directing heat flow through the module. The exploded view in FIG. 6 shows that the probe can be mounted to the base of the reservoir using thermally resistive screws of stainless steel, ceramic or similar. By using thermally resistant mounting hardware, heat transfer around the TEM 120, through the mounting components, is reduced, forcing the heat to transfer through the TEM 120. Another embodiment may utilize a thermally resistant mounting bracket, rather than mounting directly to the probe, to secure the probe to the base of the water reservoir, further reducing unwanted heat transfer around the TEM 120.

In addition, washers 126 may be installed between the screws and the mounting holes and surfaces of the probe 110. The washers 126 are made of ceramic, glass-infused composite or other thermally resistive material. Shoulder washers may be used for this purpose. Shoulder washers are inserted or press-fit into holes in the probe and protrude above the surface of the probe. Thermally resistant screws 125 are then inserted into holes within shoulder washers. This prevents the screw head as well as the shaft from contacting any part of the probe. In addition, fiber, rubber or similarly compressible washers may be installed between the reservoir and/or the mounting nuts and the ceramic or other thermally resistant washers to further reduce heat transfer and to resist mechanical shock. This prevents any metallic part of the fluid reservoir from directly contacting any metal part of the probe, reducing the loss of heat due to transfer around the TEM 120. The embodiment using a thermally resistant mounting bracket described above may be configured similarly and may also utilize thermally resistant screws and washers described above.

FIG. 6 also shows an insulation square 122 positioned underneath the probe/TEM assembly. The insulation square 122 may be made of alumina, alumina silica, fiberglass or other insulative material. Also visible in FIG. 6 is a baseplate cap 124 that secures the insulation in place and covers all components. All gaps between the base plate, the probe, and the fluid reservoir are sealed with high temperature silicone or other appropriate sealant to ensure this area is watertight.

The TGU 100 may include other or additional components. As noted, the TGU 100 may include one or more of energy storage devices, voltage regulation circuitry, payment hardware, data and payment metering devices, geolocational trackers, wireless or Bluetooth connectivity chips, or the like.

The described components of the TGU 100 may be arranged differently than shown here. For example, one or more of the charging port, metering logic, voltage regulator may be located within the handle 112, in a void within or below the insulation block 112, or the like. In some embodiments, one or more of the components is external to the TGU itself, and connected via a USB or similar connection.

The probe 110 may be detachable, collapsible, or of differing lengths depending on the application. It may be mounted to the fluid reservoir using screws, rivets or similar joining methods and insulated with ceramic washers and compressible gaskets as described above. The probe 110 is typically constructed of highly thermally conductive material such as copper, copper alloy, aluminum, aluminum carbide, aluminum nitride or other.

In addition, heat absorption at the end of the probe 110 in contact with the flame may be aided further by removing small sections of material at this end to increase surface area in contact with heat. This may be done by cutting holes or designs into or through the probe 110. Holes or fins may be cut into the probe or indentions may be made by removing material to a specific depth by etching, inscribing, milling or other material removal process. The top and sides of the probe 110 may be coated with an insulator such as moldable alumina silica, or other ceramic or composite moldable insulation. This is done to reduce the heat loss in areas where heat loss is undesirable and to focus the heat flow through the TEM 120. Additionally, probe material may be subjected to electro-chemical processes during manufacture such as anodization intended to increase or decrease radiant or other heat flow to or from the material. In another embodiment, the probe 110 may include a mounting mechanism such as a clip or small c-clamp to secure the TGU 100 to the cookstove 102 while in use.

The reservoir 111 is typically metallic and may be aluminum, steel or other suitable material. FIG. 5, looking from the top down into the reservoir 111, shows that a section of the base of the fluid reservoir 111 is removed to allow a large portion of the cold side of the TEM 120 to contact the fluid directly in order to maximize heat dissipation into the fluid. High temperature silicone or other suitable sealant material is used as a gasket to prevent leakage between the TEM 120 and the base of the reservoir.

In another embodiment of the TGU, the cold side of the TEM 120 contacts a heat sink mounted within the base of the fluid reservoir 111. The heat sink is to be manufactured out of highly conductive material such as copper, aluminum carbide, aluminum alloy or other and is designed to maximize the surface area exposed to the fluid, thus accelerating the heat dissipated via convection. The heat sink may be anodized or otherwise treated to increase its thermal transfer rate.

Another embodiment of the TGU may contain a permanent lid that reduces the potential for splash of the fluid or boiling over. Another embodiment of the TGU may be constructed out of extruded aluminum or similar with longitudinal or horizontal fins along the outer surface intended to increase the surface area exposed to ambient air thus increasing the convective heat transfer from the fluid reservoir to the surroundings. Another embodiment may include an adjustable hook mounted to the outer or inner wall of the reservoir facing outward which can allow the TGU to be attached or hung from the pot in which cooking is taking place. Other mounting mechanisms may be used to attach the TGU to the cook pot and/or cookstove. Another embodiment of the reservoir may contain a second basin or reservoir as well as a hood or lid. These hoods or lids may be designed to capture condensation leaving the first reservoir as the fluid temperature increases and direct it into the second reservoir and store it for later use as distilled water. Such an embodiment may contain additional filtration equipment intended to reduce chemical contamination concentration within the distilled water.

Such hoods and lids may be sealed under pressure and fitted with a pressure release. The increased pressure can keep the liquid at a certain preferred temperature for longer periods of time, thereby making the temperature differential greater, the device more efficient, and increasing the power generated. Such a configuration could advantageously either cool the device at specific times (which may be controlled through an onboard chip that monitors temperature and causes the pressure value to release) or increase the temperature on the hot side of the thermoelectric chip, making it hotter or keeping it hotter, longer.

Different battery charging methods are contemplated. For example, the TGU could either directly charge a battery (all at once: direct charge) or slowly charge a battery (over time: trickle charge). There may be an option for the user to select which type of charging they would like to use: trickle charging is more efficient over time, but then the user will not be able to charge a device from scratch on-demand if the user is trickle charging.

Some embodiments include a fan. The fan may be used to increase the efficiency of the stove itself by making it burn hotter and thus getting more combustion. This in turn could increase the power created by the TEM 120. This could also have the impact of "gasifying" the combustion, thereby making the stove produce fewer emissions. Gasification occurs when the stove reaches certain temperatures and conditions to cause it to burn up particular matter it otherwise would create. The fan may be integral to the TGU or separate and attached via power cable.

Some embodiments include a display device. The display device may be as minimal as a single light (e.g., LED) that uses color, intensity, and/or flashing patterns to provide information to the user. In other embodiments, the display may include multiple LEDs or even a screen output. The information provided by the display may include one or more of: charging information, safety information, usage instructions (e.g., regarding the optimal placement of the TGU with respect to the cookstove), maintenance information, tracked history information (e.g., charge dispensed, hours of operation, location), fuel consumption, environmental impact, and the like. The display may be integral to the TGU (e.g., part of the handle) or separate and attached via a power/communication cable.

Some embodiments may include a heat pipe within the probe. The heat pipe is configured to quickly transfer heat from the heat source (e.g., cookstove) to the TEM. A heat pipe is a vacuum sealed "tube" that encloses a phase liquid with a low boiling point (e.g., less than 80 C, less than 70 C, between 50-80 C, etc.). Examples of suitable liquids include ethanol (boiling point of about 78C at 1 atm), acetone (boiling point of about 56 C at 1 atm), methanol (boiling point of about 65C at 1 atm). Other fluids with higher boiling points (e.g., water) may be used in embodiments where the heat pipe is partially evacuated (e.g., water at 0.5 atm). When subjected to even moderate heat, the liquid evaporates on one end of the tube and condenses on the opposite end, quickly transferring heat energy from one side of the tube to the other. This cycle functions continuously as long as heat dissipation is also continuous. This would work on the TGU by boiling on the "fire" side and condensing on the TEM side of the probe.

Some embodiments may include a heat dissipation system. In this embodiment, one side of the heat pipe will be in contact with the cold side of the TEM where it picks up heat, boiling the fluid contain within. The vapor travels to a heat sink or similar for dissipating heat energy and condenses, depositing heat energy there. The condensed liquid returns to the original location and the cycle continues.

Figure 7:
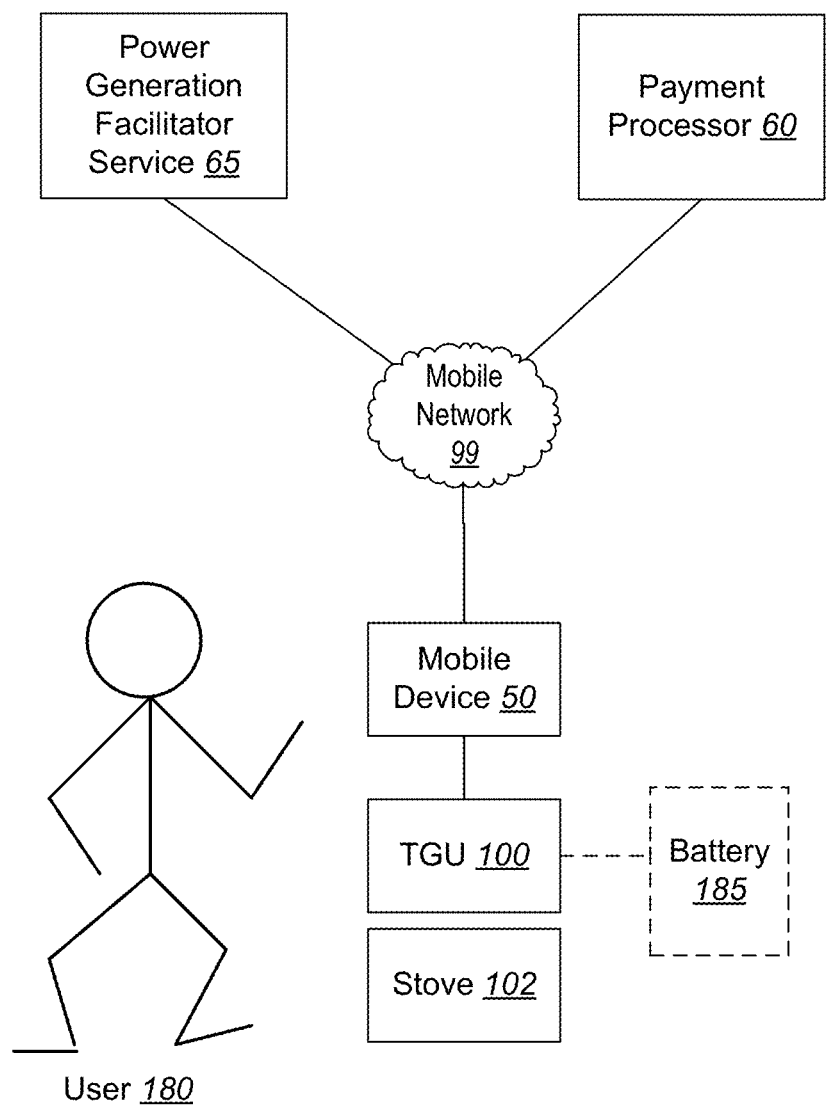
FIG. 7 is a block diagram of a system provided according to an example embodiment.

FIG. 7 is a block diagram of a system provided according to an example embodiment. The illustrated system includes a stove 102, a TGU 100, a mobile device 50, a power generation facilitator (PGF) service 65, and a payment processor 60.

A user 180 operates the mobile device 50 to effect a payment for power to be delivered by the TGU 100. The mobile device interacts via a mobile network 99 with the payment processor 60 (or indirectly via the PGF 65) in order to process a payment for power generation credits. Upon successful payment, the mobile device 50 makes a request to the TGU 100 (e.g., via the charging port or another communication port) for the delivery of a specified amount of power. Upon authenticating the request, the TGU delivers the power, either to the mobile device, an external battery 185, or some other device.

In one embodiment, the following process is employed. One or more steps may be omitted in other embodiments.

The user 180 connects his mobile device 50 (e.g., a mobile phone) to the TGU 100. The TGU 100 asks the mobile device 50 for authentication and provides key to mobile device 50 to prove legitimacy.

The mobile device 50, either through firmware or through software (including an app) uses cellular network 99 to connect with remote servers (e.g., cloud-based computing systems) to ask for a code. The remote servers may include one or more of the PGF 65 or the payment processor 60.

The remote server checks authentication key provided by TGU 100 to prove legitimacy and then checks balance of the user's account. If payment is confirmed, the remote server sends a one-time authentication key to the mobile device 50.

The mobile device 50 then relays the one-time authentication key to the TGU 100, thereby unlocking charge. The charge is delivered either to the mobile device 50 or some other device, such as the battery 185.

TGU 100 gets data from its onboard CPU (and from stove CPU if available) and then sends back to the mobile device 50 information about the TGU 100 and the stove 102, including information such as usage rates, pollution values, efficiency of device, recommended maintenance, metadata, and geo-location data for tracking purposes.

The mobile device 50 receives the data and forwards the information to a remote server, such as a telecom that hosts the PGF service 65 or some other server. If applicable, private servers run any authentication, analysis, and decryption and then may forward the information onwards to the payment processor 60 or some other destination.

Figure 8:
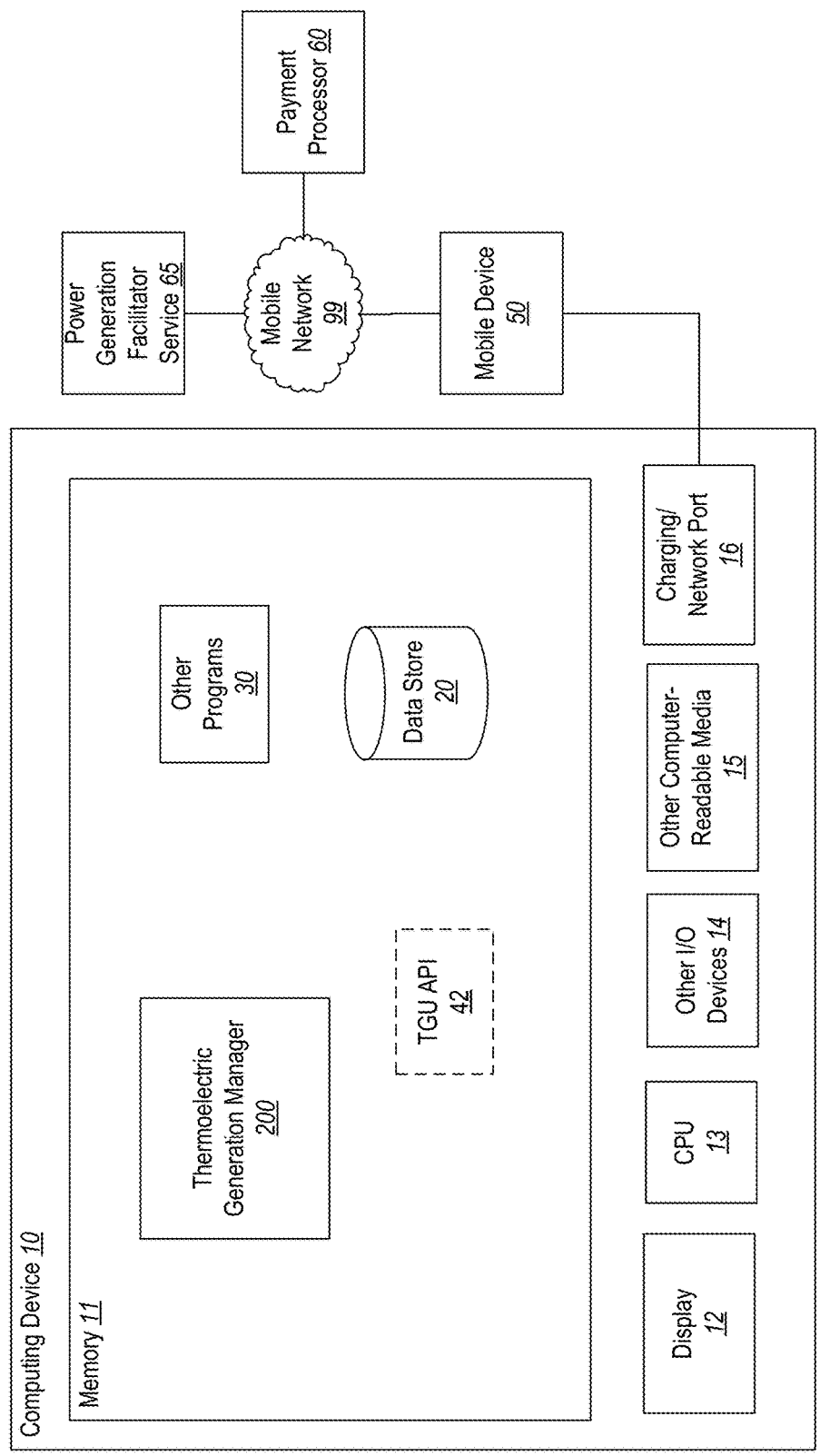
FIG. 8 is an example block diagram of an example computing device for implementing and performing power metering and other processes according to example embodiments.

FIG. 8 is an example block diagram of an example computing device for implementing and performing power metering and other processes according to example embodiments. In particular, FIG. 8 shows a computing device 10 that may be located in the handle of the TGU or elsewhere.

The computing device 10 may be utilized to implement a thermoelectric generation manager module 200. The module 200 performs one or more of the functions described herein, such as power metering, data collection, and the like. Note that one or more general purpose or special purpose computing systems/devices may be used to implement the module 200. In addition, the computing device 10 may comprise one or more distinct computing systems/devices and may span distributed locations. Furthermore, each block shown may represent one or more such blocks as appropriate to a specific embodiment or may be combined with other blocks. Also, the module 200 may be implemented in software, hardware, firmware, or in some combination to achieve the capabilities described herein.

In the embodiment shown, computing device 10 comprises a computer memory ("memory") 11, a display 12, one or more Central Processing Units ("CPU") 13, Input/Output devices 14 (e.g., keyboard, mouse, CRT or LCD display, and the like), other computer-readable media 15, and a charging/network port 16. The charging/network port 16 may be a USB port or similar. In other embodiments, charging and network ports may be provided separately from one another.

The module 200 is shown residing in memory 11. In other embodiments, some portion of the contents, some or all of the components of the module 200 may be stored on and/or transmitted over the other computer-readable media 15. The module 200 preferably executes on one or more CPUs 13 and performs the techniques described herein. Other code or programs 30 (e.g., an administrative interface) and potentially other data repositories, such as data repository 20, also reside in the memory 11, and preferably execute on one or more CPUs 13. Of note, one or more of the components in FIG. 8 may not be present in any specific implementation. For example, typical embodiments may not include the display 12, I/O devices such as keyboards or mice, and the like.

The module 200 interacts via the charging/network port 16 with a mobile device 50. The mobile device may be a cell phone, smart phone, tablet, battery pack, or similar. The mobile device 50 interacts via a mobile network 99 (e.g., a cellular network, Wi-Fi network) with a payment processor 60 and/or a power generation facilitator ("PGF") service 65. The payment processor 60 may be part of a mobile payment system, such as M-Pesa. The mobile device 50 may include an app or similar software that is used to purchase credits, authorization, or other indicators of value that may be provided to the module 200 in order to enable charging via the port 16.

The module 200 may include metering logic discussed above. For example, the payment processor 60 or PGF 65 may provide the mobile device 50 a key, token, or other authorization request/indicator that authorizes the delivery of a specified amount of power. This request is then transmitted by the mobile device 50 to the module 200. The module 200 determines whether the authorization request is authentic. The indicator may be encrypted with a secret key (e.g., in symmetric or asymmetric encryption) of the TGU, such that the module 200 can determine whether the receive request is authentic by decrypting the received request. If the request is authentic, then the module 200 enables charging via the port 16. The module 200 then monitors the amount of power delivered by the port 16. When the specified amount of power has been delivered, the module disables 200 the charging port 16.

As also discussed above, the module 200 may perform tracking functions, such as recording environmental data, location data, usage information, and the like. This tracking data may be stored in the data store 20 or other location, and then provided to client systems upon request.

Also included in the memory 11 is an application program interface ("API") 42. The API 42 is drawn in dashed lines to indicate that in other embodiments, functions performed by one or more of these components may be performed externally to the module 200. The API 42 provides programmatic access to one or more functions of the module 200. For example, the API 42 may provide a programmatic interface to one or more functions of the module 200 that may be invoked by one of the other programs 30 or some other module. In this manner, the API 42 facilitates the development of third-party software, such as user interfaces, plug-ins, adapters (e.g., for integrating functions of the module 200 into Web applications), and the like.

In addition, the API 42 may be in at least some embodiments invoked or otherwise accessed via remote entities, such as code executing on the mobile device 50, the payment processor 60, and/or the PGF 65. For example, the mobile device 50 may request, via the API 42, tracking data stored by the module 200 during a metered charging interaction. This tracking data may then be forwarded to the PGF 65 or similar service.

In an example embodiment, components/modules of the module 200 are implemented using standard programming techniques. For example, the module 200 may be implemented as a "native" executable running on the CPU 13, along with one or more static or dynamic libraries. In other embodiments, the module 200 may be implemented as instructions processed by a virtual machine that executes as one of the other programs 30. In general, a range of programming languages known in the art may be employed for implementing such example embodiments.

The various components may be implemented using more monolithic programming techniques, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments may execute concurrently and asynchronously, and communicate using message passing, remote procedure call, or other distributed computing paradigms. Equivalent synchronous embodiments are also supported. Also, other functions could be implemented and/or performed by each component/module, and in different orders, and by different components/modules, yet still achieve the described functions.

Different configurations and locations of programs and data are contemplated for use with techniques of described herein. A variety of distributed computing techniques are appropriate for implementing the components of the illustrated embodiments in a distributed manner including but not limited to TCP/IP sockets, RPC, RMI, HTTP, Web Services (XML-RPC, JAX-RPC, SOAP, and the like). Other variations are possible. Also, other functionality could be provided by each component/module, or existing functionality could be distributed amongst the components/modules in different ways, yet still achieve the functions described herein.

Furthermore, in some embodiments, some or all of the components of the module 200 may be implemented or provided in other manners, such as at least partially in firmware and/or hardware, including, but not limited to one or more application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of the system components and/or data structures may also be stored as contents (e.g., as executable or other machine-readable software instructions or structured data) on a computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of the components and/or data structures may be stored on tangible, non-transitory storage mediums. Some or all of the system components and data structures may also be stored as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

All of the above U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 62/153,421 filed on Apr. 27, 2015 and entitled "THERMOELECTRIC GENERATOR FOR COOKSTOVE," are incorporated herein by reference, in their entireties.

While embodiments of the invention have been illustrated and described, as noted above, many changes can be made without departing from the spirit and scope of the invention. Accordingly, the scope of the invention is not limited by the above disclosure.

The invention claimed is:

1. A thermoelectric generation unit, comprising:
   a reservoir configured to hold a liquid;
   a handle coupled to the reservoir;
   a heat conductive probe that is coupled to the reservoir and that is configured to conduct heat obtained from a heat source; and
   a thermoelectric generation module that is positioned between the probe and the reservoir, such that a temperature gradient is produced within the thermoelectric generation module due to a relative temperature difference between the probe and liquid within the reservoir, wherein the thermoelectric generation module generates an electric current based on the temperature gradient.

2. The thermoelectric generation unit of claim 1, further comprising:
   a charging port electrically coupled to the thermoelectric generation module.

3. The thermoelectric generation unit of claim 2 wherein the charging port is part of the handle.

4. The thermoelectric generation unit of claim 2, further comprising:
   voltage regulation logic coupled to the thermoelectric generation module and to the charging port, wherein the voltage regulation logic is configured to condition electrical current produced by the thermoelectric generation module.

5. The thermoelectric generation unit of claim 2, wherein the charging port is a USB dedicated charging port.

6. The thermoelectric generation unit of claim 2, further comprising:
   a metering module configured to:
      receive an instruction to provide a specified amount of power;
      in response to the received instruction, enable the charging port to provide power to a device connected to the charging port; and
      when the specified amount of power has been delivered via the charging port, disable the charging port.

7. The thermoelectric generation unit of claim 6, wherein the metering module is further configured to: authenticate the received instruction, based on a unique identifier assigned to and stored in a memory of the thermoelectric generation unit.

8. The thermoelectric generation unit of claim 2, further comprising:
   a battery for storing power produced by the thermoelectric generation module.

9. The thermoelectric generation unit of claim 8, further comprising charging logic configured to trickle charge the battery.

10. The thermoelectric generation unit of claim 9, wherein the charging logic is configured to direct charge or trickle charge the battery, based on a user selection.

11. The thermoelectric generation unit of claim 1, further comprising a fan powered by electricity generated by the thermoelectric generation module, wherein the fan is configured to increase combustion of fuel in a woodstove that is the heat source.

12. The thermoelectric generation unit of claim 1, further comprising:
a fan electrically coupled to the thermoelectric generation module; and
a charging port electrically coupled to the thermoelectric generation module.

13. The thermoelectric generation unit of claim 1, further comprising:
a display device configured to provide information about operation of the thermoelectric generation unit, including one or more of: safety information, maintenance information, device usage instructions, charging information, and device history information.

14. The thermoelectric generation unit of claim 13, wherein the display device is incorporated into the handle of the thermoelectric generation unit.

15. The thermoelectric generation unit of claim 1, further comprising:
a heat pipe incorporated into the heat probe, wherein the heat pipe is a vacuum sealed tube that includes a phase liquid with a boiling point below 80 C, such that exposure to moderate heat causes liquid to evaporate at a first end of the heat pipe and condense at a second end of the heat pipe, thereby transferring heat from one end of the heat pipe to the other.

16. The thermoelectric generation unit of claim 1, further comprising:
a heat pipe having one end coupled to the thermoelectric generation module;
a heat sink coupled to a second end of the heat pipe, wherein the heat pipe picks up heat from the thermoelectric generation module and delivers it to the heat sink for dissipation.

17. A system comprising:
the thermoelectric generation unit of claim 1;
a mobile device coupled to the thermoelectric generation unit via the charging port, wherein the mobile device includes logic that is configured to:
obtain an authorization from a payment processor; and
transmit to the thermoelectric generation unit an instruction to provide a specified amount of power, wherein the instruction is based upon the obtained authorization.

18. The system of claim 17, wherein the mobile device logic is further configured to:
obtain device history information from the thermoelectric generation unit; and
transmit the device history information to a remote tracking service.

19. The system of claim 17, further comprising:
a battery pack that is distinct from the mobile device and that is coupled to the thermoelectric generation unit, wherein the thermoelectric generation unit delivers the specified amount of power to the battery pack after receiving the instruction.

20. A method in a thermoelectric generation unit, comprising:
receiving an request to provide a specified amount of power, the request received from a mobile device that is coupled to the thermoelectric generation unit;
determining, based on a unique identifier stored on a memory of the thermoelectric generation unit, that the request is authorized;
in response to the received instruction, enabling the charging port to provide power to a device connected to the charging port; and
when the specified amount of power has been delivered via the charging port, disabling the charging port.

* * * * *